(12) United States Patent
Borthakur

(10) Patent No.: US 10,559,618 B2
(45) Date of Patent: Feb. 11, 2020

(54) METHODS AND APPARATUS FOR AN IMAGE SENSOR

(71) Applicant: SEMICONDUCTOR COMPONENTS INDUSTRIES, LLC, Phoenix, AZ (US)

(72) Inventor: Swarnal Borthakur, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 208 days.

(21) Appl. No.: 15/408,839

(22) Filed: Jan. 18, 2017

(65) Prior Publication Data

US 2018/0204861 A1   Jul. 19, 2018

(51) Int. Cl.
   *H01L 27/146* (2006.01)
(52) U.S. Cl.
   CPC .... *H01L 27/1463* (2013.01); *H01L 27/14621* (2013.01); *H01L 27/14645* (2013.01); *H01L 27/14685* (2013.01); *H01L 27/14689* (2013.01)
(58) Field of Classification Search
   CPC ................. H01L 27/1463; H01L 27/14621
   See application file for complete search history.

(56) References Cited

U.S. PATENT DOCUMENTS

| 9,893,111 B2 * | 2/2018 | Chou ................. G03B 13/36 |
| 9,991,307 B2 * | 6/2018 | Cheng ............... H01L 27/1464 |
| 10,032,819 B2 * | 7/2018 | Lee .................. H01L 27/1463 |
| 2008/0258249 A1 | 10/2008 | Hong |
| 2009/0230394 A1 | 9/2009 | Nagaraja |
| 2010/0051790 A1 * | 3/2010 | Park .............. H01L 27/14621 250/227.2 |
| 2014/0264685 A1 | 9/2014 | Cheng |
| 2015/0171125 A1 * | 6/2015 | Jangjian ........ H01L 27/14627 257/432 |

OTHER PUBLICATIONS

Orit Skorka, et al., Method for Quantifying Image Sensor Susceptibilty to Chromatic Flare Artifacts, Digital Photography and Mobile Imaging XII, IS&T International Symposium on Electronic Imaging, 2016, Society for Imaging Science and Technology.

* cited by examiner

*Primary Examiner* — Jose R Diaz
(74) *Attorney, Agent, or Firm* — The Noblitt Group, PLLC; Hettie L. Haines

(57) ABSTRACT

Various embodiments of the present technology may comprise a method and apparatus for an image sensor. The image sensor may comprise a color filter with a convex surface and a corresponding underlying dielectric element. The convex surface of the color filter is parallel to a convex surface of the dielectric element, wherein the convex shape of the color filter is substantially equal to the convex shape of the dielectric element.

19 Claims, 12 Drawing Sheets

METHODS AND APPARATUS FOR AN IMAGE SENSOR

BACKGROUND OF THE TECHNOLOGY

Electronic devices, such as cellular telephones, cameras, and computers, commonly use image sensors to capture images. A typical CMOS (complementary metal-oxide-semiconductor) imager circuit includes a focal plane array of pixels, and each pixel includes a photo-sensor, such as a photogate, or photodiode, for accumulating photo-generated charge in a portion of the substrate.

Many conventional high-performance image sensors are described by one or more specifications, such as high resolution, high dynamic range, high speed, high quantum efficiency, low noise, low dark current, no image lag, charge storage capacity, output voltage swing, etc. While some of the specifications are interrelated, some are trade-offs due to the physical properties and the design of the image sensor. For example, as the pixel size decreases, the amount of light that reaches the photosensor decreases, which may result in low quantum efficiency. Additionally, image sensors with pixels and/or circuits that are very close to each other may exhibit optical artifacts due to noise, charge migrating to adjacent photosensors, and/or cross-talk, which negatively impacts the image quality.

SUMMARY OF THE INVENTION

Various embodiments of the present technology may comprise a method and apparatus for an image sensor. The image sensor may comprise a color filter with a convex surface and a corresponding underlying dielectric element. The convex surface of the color filter is parallel to a convex surface of the dielectric element, wherein the convex shape of the color filter is substantially equal to the convex shape of the dielectric element.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates an imaging system in accordance with an exemplary embodiment of the present technology;

FIGS. 7A-F is a method for forming an image sensor in accordance with an exemplary embodiment of the present technology; and FIGS. 8A-J is a method for forming an image sensor in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various sampling circuits, analog-to-digital converters, semiconductor devices, such as transistors, capacitors, image processing units, and the like, which may carry out a variety of functions. In addition, the present technology may be practiced in conjunction with any number of systems, such as automotive, aerospace, imaging, surveillance, and consumer electronics, and the systems described are merely exemplary applications for the technology. Further, the present technology may employ any number of conventional techniques for capturing image data, sampling image data, processing image data, and the like.

Methods and apparatus for an image sensor according to various aspects of the present technology may operate in conjunction with any suitable electronic system, such as imaging systems, "smart devices," wearables, consumer electronics, and the like. Further, methods and apparatus for the image sensor may be utilized with any suitable imaging system, such as a camera system, video system, machine vision, vehicle navigation, surveillance system, motion detection system, and the like.

Figure 1:
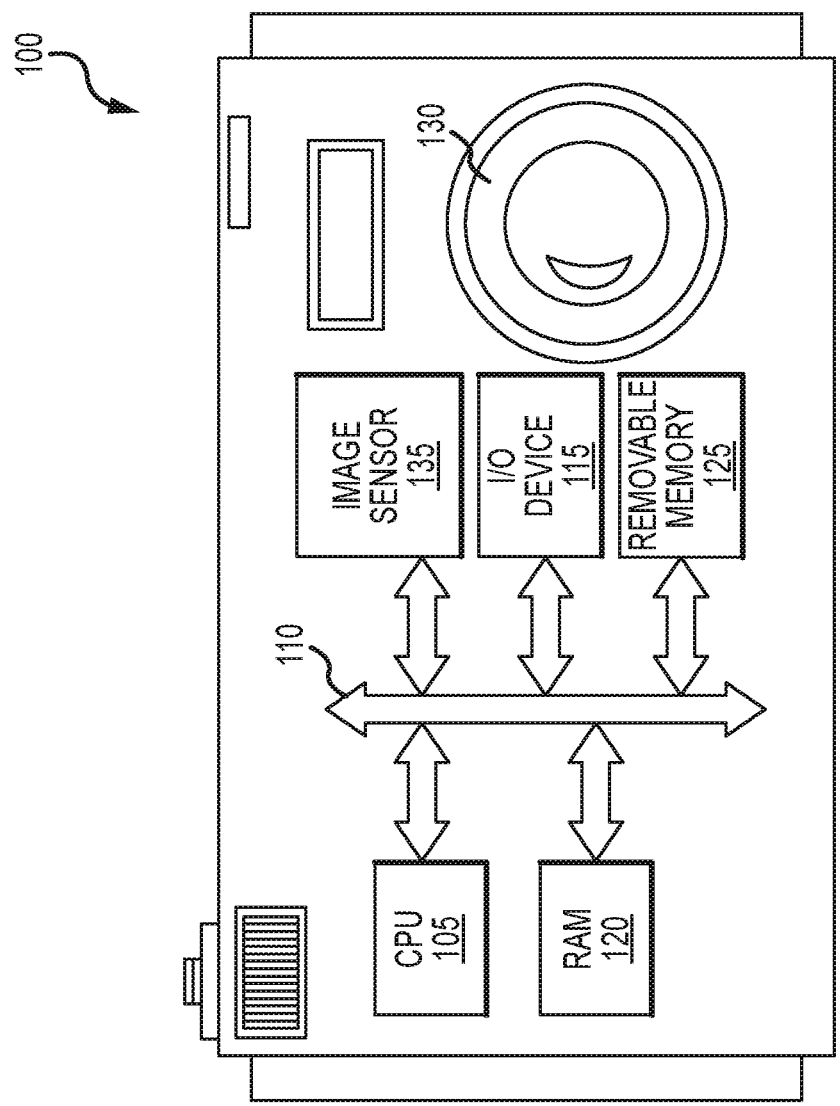
Figure 2:
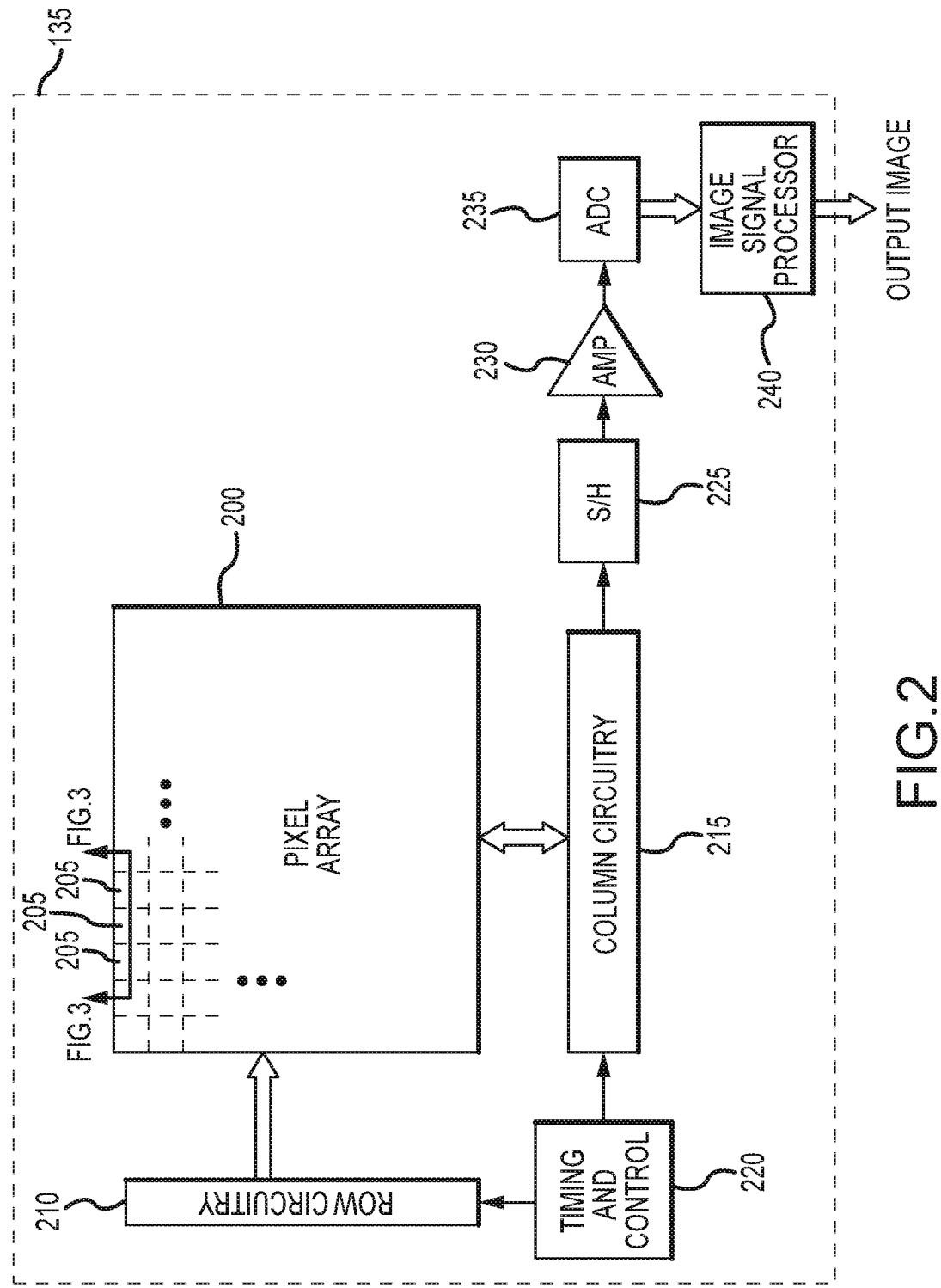
FIG. 2 is a block diagram of an image sensor in accordance with an exemplary embodiment of the present technology.

Referring to FIGS. 1 and 2, an exemplary imaging system may comprise an electronic device, such as a digital camera 100. In one embodiment, the imaging system may comprise a central processing unit (CPU) 105 that communicates with various devices over a bus 110. Some of the devices connected to the bus 110 may provide communication into and out of the system, for example an input/output (I/O) device 115. Other devices connected to the bus 110 provide memory, for example a random access memory (RAM) 120, hard drive, and one or more peripheral memory devices 125, such as a USB drive, memory card, and SD card. While the bus 110 is illustrated as a single bus, any number of busses may be used to provide communication paths to interconnect the devices. The imaging system may further comprise a device to focus images, such as a lens 130. For example the lens 130 may include a fixed and/or adjustable focus lens.

The imaging system may further comprise an image sensor 135 for capturing image data. For example, light may enter the imaging system through the lens 130 and strike the image sensor 135. The image sensor 135 may be implemented in conjunction with any appropriate technology, such as active pixel sensors in complementary metal-oxide-semiconductors (CMOS) and charge-coupled devices.

The image sensor 135 may comprise a pixel array 200 to detect the light and convey information that constitutes an image by converting the variable attenuation of waves (as they pass through or reflect off object) into electrical signals. The pixel array 200 may comprise a plurality of pixels 205 arranged to form rows and columns, and the pixel array 200 may contain any number of rows and columns, for example, hundreds or thousands of rows and columns. Each pixel 205 may comprise a photosensor, such as a photogate, a photodiode, and the like, to detect light and convert the detected light into a charge.

The image sensor 135 may further comprise various circuits to transform the charge into a pixel signal, amplify the signal, and perform various processing on the signal. For example, the image sensor 135 may comprise row circuitry 210, column circuitry 215, and a timing and control unit 220, to selectively activate sequential rows of pixels and transmit the pixel signal to a sample-and-hold circuitry 225. After sampling, the image sensor 135 may transmit the pixel signal to an amplifier 230, wherein the amplifier 230 amplifies the signal prior to being converted to a digital signal by an analog to digital converter 235. The digital pixel data may then be transmitted to and stored in the image signal processor 240 for further processing.

In various embodiments, the image signal processor 240 may perform various processing signal functions, such as demosaicing, autofocus, exposure, noise reduction, and white balance, to produce a final output image. The image signal processor 240 may comprise any number of semiconductor devices, such as transistors, capacitors, and the like, for performing calculations, transmitting and receiving image pixel data, and a storage unit, such as random-access memory, non-volatile memory or any other memory device suitable for the particular application, for storing image pixel data. In various embodiments, the image signal processor 240 may be implemented with a programmable logic device, such as a field programmable gate array (FPGA) or any other device with reconfigurable digital circuits. In other embodiments, the image signal processor 240 may be implemented in hardware using non-programmable devices. In alternative embodiments, the image signal processor 240 may be formed partially or entirely within an integrated circuit in silicon using any suitable complementary metal-oxide semiconductor (CMOS) techniques or fabrication processes, in an ASIC (application-specific integrated circuit), using a processor and memory system, or using another suitable implementation.

The image sensor 135 may transmit the output image to an output device, such as a display screen or a memory component, for storing and/or viewing the image data. For example, the output image may be transmitted to the I/O device 115. The output device may receive digital image data, such as video data, image data, frame data, and/or gain information from the image signal processor 120. In various embodiments, the output device may comprise an external device, such as a computer display, memory card, or some other external unit.

Referring to FIGS. 3 through 6, in various embodiments, the image sensor 135 may comprise a substrate 305 to form various components of the image sensor 135 therein and to provide a stable surface for forming optical components thereon. The substrate 305 may comprise one or more materials, layers, and/or structures, and may comprise a silicon portion 365. For example, in various embodiments, circuits, such as the row circuitry 210 and column circuitry 215, the pixels 205, a color filter system, and an in-pixel grid 320 may be formed in and/or on the substrate 305.

In various embodiments, the substrate 305 may further comprise a plurality of isolation trenches 310 to prevent charge leakage between adjacent pixels 205. The isolation trenches 310 may be arranged to separate the photosensors of adjacent pixels 205. In various embodiments, the isolation trenches 310 may extend from a major surface of the substrate 305 to an inner portion of the substrate 305. In alternative embodiments, the isolation trench 310 may extend all the way through the substrate 305, beginning at one major surface and ending at an opposing major surface. The isolation trenches 310 may comprise any suitable material for attenuating cross-talk, blooming, and optical cross-talk. The isolation trenches 310 may be formed using a front side deep trench isolation process, a backside deep trench isolation process, or any other suitable method. The formation method may be selected according to a particular application.

In various embodiments, the substrate 305 may further comprise a first dielectric layer 315 to prevent charge buildup and to reduce dark current. The first dielectric layer 315 may comprise a high-k material, such as hafnium oxide ($HfO_2$), tantalum pentoxide ($Ta_2O_5$), zirconium dioxide ($ZrO_2$), aluminum oxide ($Al_2O_3$), or any other suitable high-k material. In various embodiments, the first dielectric layer 315 may be arranged at the major surface of the substrate 305. In embodiments comprising the isolation trenches 310, the first dielectric layer 315 may also be arranged along a perimeter of each isolation trench 310.

In various embodiments, the image sensor 135 may further comprise a second dielectric layer 335 to facilitate the assembly of image sensor 135 and/or facilitate connections between the image sensor 135 and peripheral devices or systems. For example, the second dielectric layer 335 may facilitate integration of a wire bond pad at an edge of the image sensor 135 die, integration with a metal light block in the periphery, and/or integration of a through-Si-via used for stacking the image sensor 135 with a processor die. In various embodiments, the second dielectric layer 335 may be arranged along the major surface of the substrate 305. The second dielectic layer 335 may comprise a material such as silicon nitride (Si3N4), silicon oxynitride (SiON), silicon carbide (SiC), silicon oxycarbide (SiOC), and the like. The second dielectric layer 335 may be formed to have a predetermined refractive index. For example, the type of the material and/or thickness of the material may be selected to have a refractive index of approximately 1.7 to 2.

In various embodiments, the second dielectric layer 335 may be arranged as an array of dielectric elements 325, wherein each dielectric element 325 corresponds to and vertically aligns with one pixel 205 of the pixel array 200. Each dielectric element 325 may comprise a convex surface 360 extending upwardly away from the substrate 305 forming a dome-like shape with a substantially circular base or a substantially square base. Thus, each dielectric element 325 has an arched surface profile extending from a first edge 390 to a second edge 395 with respect to a first cross-section, and from a third edge (not shown) to a fourth edge (not shown) with respect to a second cross-section, wherein the second cross-section is perpendicular to the first cross-section, such that a center portion of the dielectric element 325 may have a first thickness T, and the first and second edges may have a second thickness t, wherein the first thickness T is greater than the second thickness t.

Figure 3:
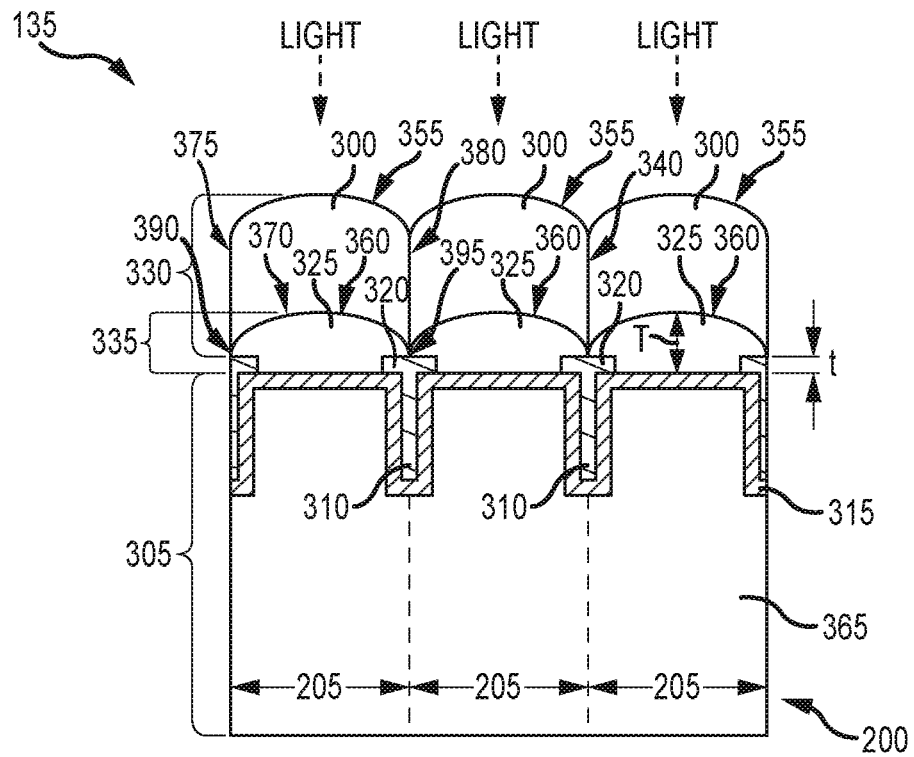
FIG. 3 is a cross-sectional view of an image sensor in accordance with an exemplary embodiment of the present technology.
Figure 4:
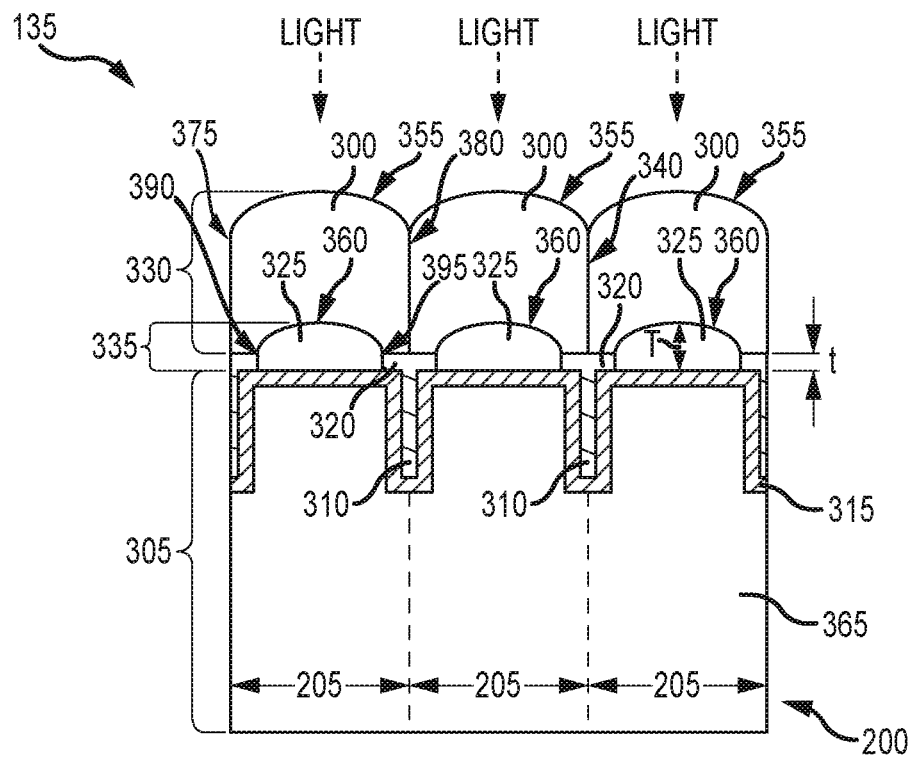
FIG. 4 is a cross-sectional view of an image sensor in accordance with an exemplary embodiment of the present technology.
Figure 5:
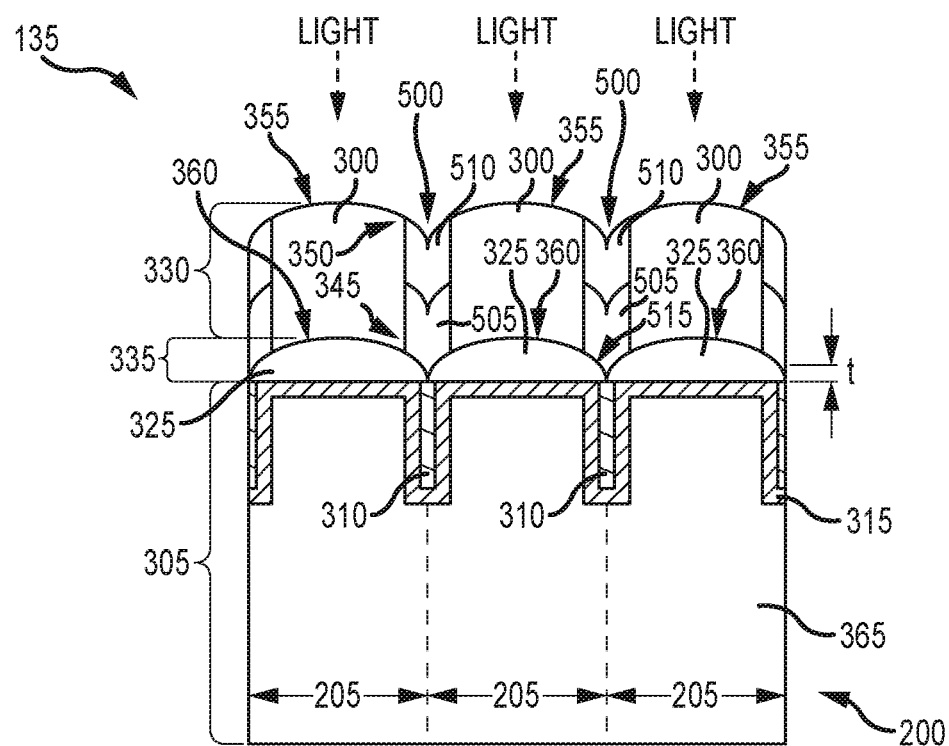
FIG. 5 is a cross-sectional view of an image sensor in accordance with an exemplary embodiment of the present technology.
Figure 6:
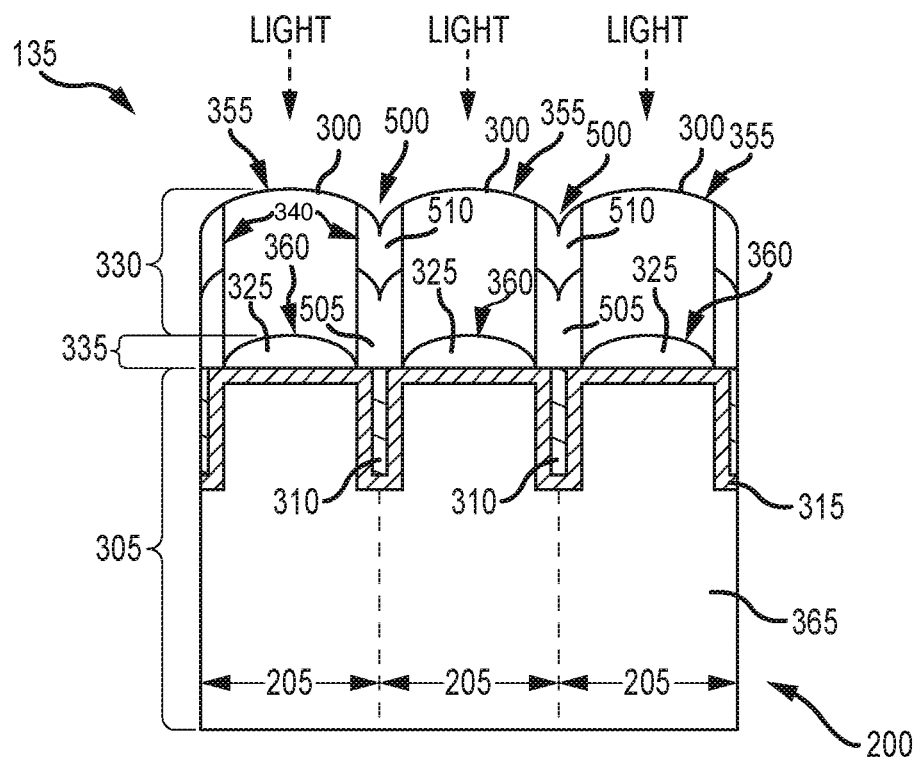
FIG. 6 is a cross-sectional view of an image sensor in accordance with an exemplary embodiment of the present technology.

In various embodiments, adjacent dielectric elements 325 may abut one another, for example as illustrated in FIGS. 3 and 5. In alternative embodiments, adjacent dielectric elements 325 may be separated by the in-pixel grid system, for example as illustrated in FIGS. 4 and 6.

The color filter system, such as a color filter array (CFA) 330, to filter impinging light according to wavelength. The CFA 330 may comprise a pattern of color filters 300 situated on the pixel array 200 to capture color information. In an exemplary embodiment, each pixel 205 is covered with an individual color filter 300 of the CFA 330. For example, a Bayer color filter array comprising a pattern of red, blue, and green filters may be provided, wherein each pixel 205 is covered with one of a red, blue, or green filter. In other embodiments, the CFA 330 may be formed using other color filters, such as a CYYM filter (one cyan, two yellow, and one magenta), a CYGM filter (one cyan, one yellow, one green, and one magenta), a CRGB filter (one cyan, one red, one green, and one blue), and any other suitable color pattern. In various embodiments, the CFA 330 may comprise "clear" or transparent filter elements. The CFA 330 may form a 2×2 color pattern, a 4×4 color pattern, a 2×4 color pattern, or any other suitable pattern size. In various embodiments, the CFA 330 may repeat to cover the entire pixel array 200.

In various embodiments, the CFA 330 may be disposed on and conform to the shape of the convex surfaces 360 of the dielectric elements 325. As such, as light enters the image sensor 135, the light must pass through at least the color filter 300 and the dielectric element 325 before reaching the photosensor.

Each individual color filter 300 may further be arranged to direct light to the photosensor. For example, each color filter 300 may also operate as a microlens, thus eliminating the need to form a separate conventional microlens array on the CFA 330. Eliminating the separate conventional microlens has several advantages, including a decrease in cost to fabricate the image sensor 135, as well as increasing the amount of light that reaches the photosensor, since some of the light is absorbed by each layer of material that it passes through before it reaches the photosensor. Thus, an image sensor with a reduced overall thickness and/or fewer layers may detect more light than an image sensor with a conventional microlens array.

Each individual color filter 300 may have a first surface 370 that generally conforms to, replicates, or otherwise matches the convex shape of the underlying dielectric element 325. Each color filter 300 may further comprise a second convex surface 355 forming a dome-like shape with a substantially circular base or a substantially square base. Thus, each color filter 300 has an arched surface profile extending from a first edge 375 to a second edge 380 with respect to the first cross-section, and from a third edge (not shown) to a fourth edge (not shown) with respect to the second cross-section. The second convex surface 355 may be opposite from (e.g., positioned above) the first surface 370 of the color filter 300. The second convex surface 355 may be substantially equal to the convex shape of the underlying dielectric element 325. Symmetry between the second convex surface 355 of the color filter 300 and the arch of the underlying dielectric element 325 ensures a uniform optical depth (thickness) from the second convex surface 355 of the color filter 300 to the convex surface of the dielectric element 325. As such, the color filter 300 will uniformly filter the incoming light, thus increasing the image color quality.

In various embodiments, the in-pixel grid system reflects light into the photosensor of each pixel 205, thus increasing the quantum efficiency of the image sensor 135. The in-pixel grid system also prevents high-incidence angle light that is filtered with one color filter, for example a green filter, from being absorbed by an adjacent photosensor with a different color filter, for example a red filter. Light absorbed in this manner may result in a phenomenon referred to as crosstalk, which manifests as chromatic flare artifacts, specifically purple flare artifacts, and negatively impacts the image quality. The in-pixel grid system may comprise a series of intersecting structures formed on and/or above the major surface of the substrate 305 and between the rows and columns of the pixel array 200. In various embodiments, the in-pixel grid system may comprise a metal material, such as titanium, aluminum, copper, tungsten, or other suitable metal. In other embodiments, the in-pixel grid system may comprise a combination of a metal material, such as titanium, aluminum, copper, tungsten, or other suitable metal, and a dielectric material, such as silicon dioxide ($SiO_2$), silicon nitride ($Si_3N_4$), silicon oxynitride (SiON).

In various embodiments, and referring to FIGS. 3 and 4, the in-pixel grid system may comprise a metal grid structure 320 arranged proximate to the substrate 305 and between adjacent row and adjacent columns of the pixel array 200. In the present embodiments, a sidewall 340 one color filter abuts the sidewall 340 of an adjacent color filter.

In one embodiment, and referring to FIG. 3, the metal grid structure 320 may be separated from at least one color filter 300 by the dielectric element 325. In the present embodiment, the dielectric element 325 may overlap a portion of the metal grid structure 320.

In an alternative embodiment, and referring to FIG. 4, the metal grid structure 320 may abut a portion of at least one color filter 300. In the present embodiment, the dielectric elements 325 may be separated by the metal grid structure 320.

In various embodiments, and referring to FIGS. 5 and 6, the in-pixel grid system may comprise a composite grid structure 500 arranged to separate the sidewalls 340 of adjacent color filters 300. The composite grid structure 500 may comprise a metal portion 505 and a dielectric portion 510. The composite grid structure 500 may comprise a first end 345 proximate to the substrate 305 a second end 350 at or near the surface 355 of at least one color filter 300.

In one embodiment, and referring to FIG. 5, the first end 345 of the composite grid structure 500 may comprise at least one tapered edge 515. For example, the first end 345 may comprise two tapered edges, wherein the edges taper to a center point. In one embodiment, the first end 345 may abut the substrate 305, however, in alternative embodiments, the first end 345 may not abut the substrate 305. In the present embodiment, adjacent dielectric elements 300 abut each other, thus forming the tapered first end 345 of the composite grid structure 500.

In an alternative embodiment, and referring to FIG. 6, the composite grid structure 500 may have a substantially uniform width from the first end 345 to the second end 350. In the present embodiment, adjacent dielectric elements 300 may be separated by the composite grid structure 500.

In yet another alternative embodiment, the first end 345 of the composite wall 50 may narrow without ending in a point. The shape of the first end 345 of the composite grid structure 500 will depend on the spacing and position of the dielectric elements 325. Thus, the first end 345 may have a shape that ranges from the tapered point to one that has no taper.

The image sensor 135 may be formed utilizing various processing methods and steps. Various processing and fabrication steps may be performed using conventional fabrication processes and methods. The processing techniques and/or methods may be selected according to various factors, such as cost, application, and fabrication plant limitations.

Figure 7A:
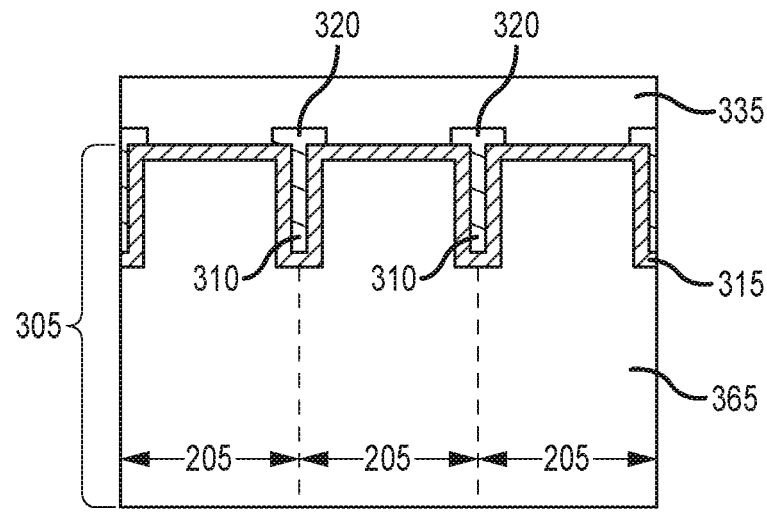

Referring to FIGS. 7A-F, a method for forming an image sensor may comprise preparing the substrate 305 by preparing a series of trenches between adjacent pixels 205, lining the trenches with the first dielectric layer 315, and filling each trench with a material to form a series of isolation trenches 310. The in-pixel grid system, for example the in-pixel grid 320, may then be formed on a first end of the isolation trench 310. The second dielectric layer 335 may then be deposited to cover the in-pixel grid system as well as the exposed substrate 305 (FIG. 7A).

Figure 7B:
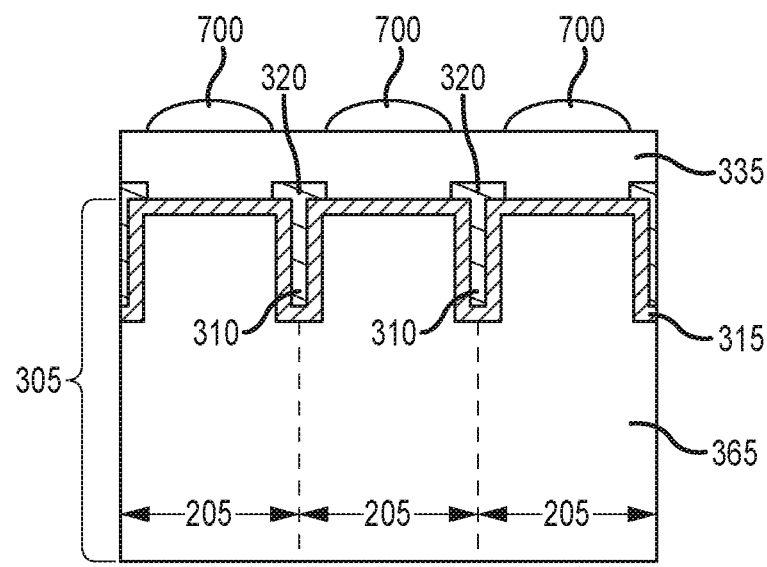
Figure 7C:
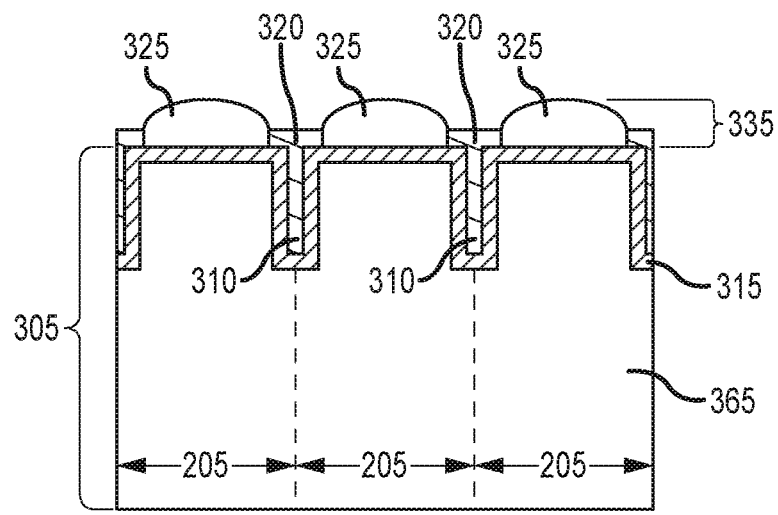

A plurality of first photoresist structures 700 may be formed on the surface of the second dielectric layer 335 (FIG. 7B). The first photoresist structures 700 are formed to have a convex surface. Conventional photolithography methods and processes may be utilized to form the first photoresist structures 700. Dry etch may then be performed to transfer the shape of the first photoresist structures 700 to the second dielectric layer 335 to form the dielectric elements 325 (FIG. 7C). For example, the dry etching process may utilize carbon tetrafluoride ($CF_4$), octafluorocyclobutane ($C_4F_8$), sulfur hexafluoride ($SF_6$), any other suitable gas, or combination thereof. In the present embodiment, the dielectric elements 325 do not overlap the in-pixel grid 320. In other embodiments, however, the dielectric elements 325 may overlap the in-pixel grid 320, such as the dielectric elements 325 illustrated in FIG. 3. The size and position of the first photoresist structures 700 may substantially dictate the size and position of the dielectric elements 325.

Figure 7D:
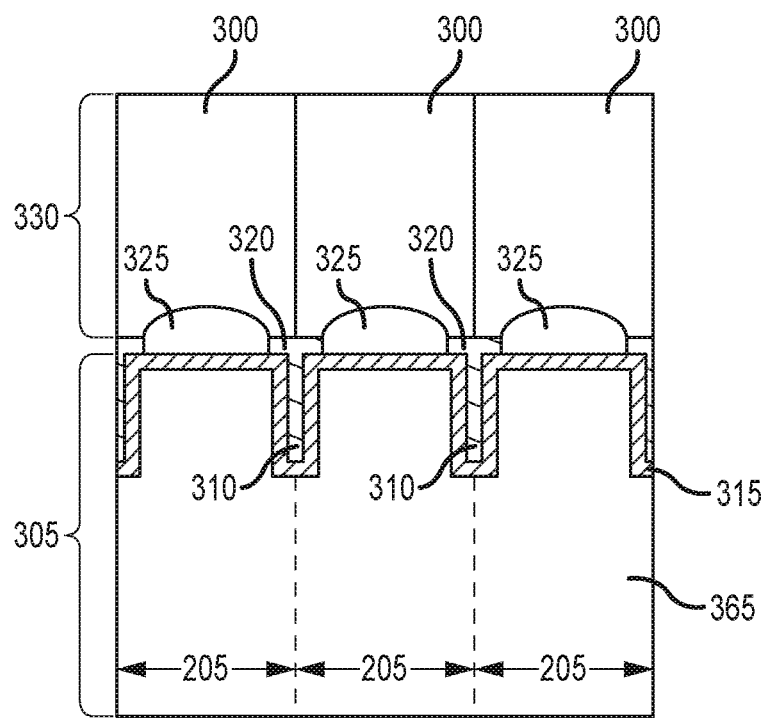

The CFA 330 is then deposited on the dielectric elements 325 (FIG. 7D). In the present embodiment, the CFA 330 contacts a portion of the in-pixel grid 320 since the adjacent dielectric elements 325 are separated by the in-pixel grid 320. In other embodiments, however, the color filters 300 may not contact the in-pixel grid 320, for example the CFA 330 illustrated in FIG. 3.

Figure 7E:
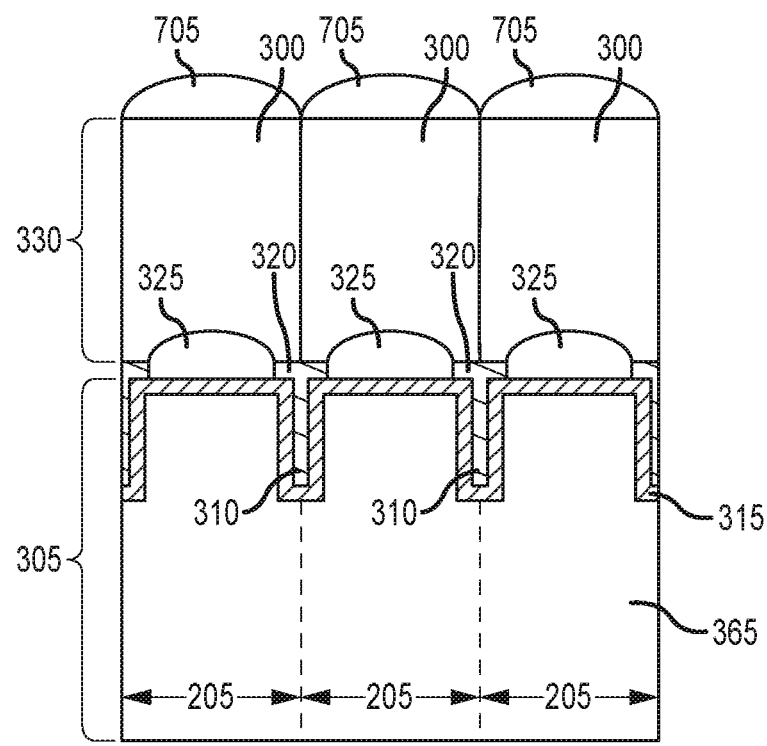
Figure 7F:
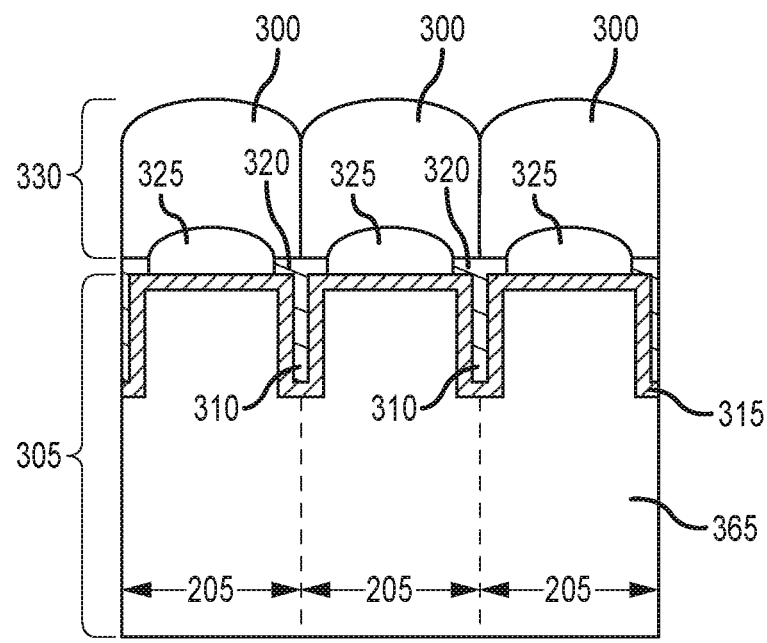

A plurality of second photoresist structures 705 are formed on the CFA 330 (FIG. 7E). The second photoresist structures 705 may be formed in a similar manner as the first photoresist structures 700, wherein the second photoresist structures 705 have substantially the same convex shape and arched profile as the first photoresist structures 700. Dry etch may then be performed again to transfer the shape of the second photoresist structures 705 to the CFA 330 to form the color filters 300 that also operate as microlenses (FIG. 7F). For example, the dry etching process may utilize carbon tetrafluoride ($CF_4$), octafluorocyclobutane ($C_4F_8$), sulfur hexafluoride ($SF_6$), any other suitable gas, or combination thereof.

Figure 8A:
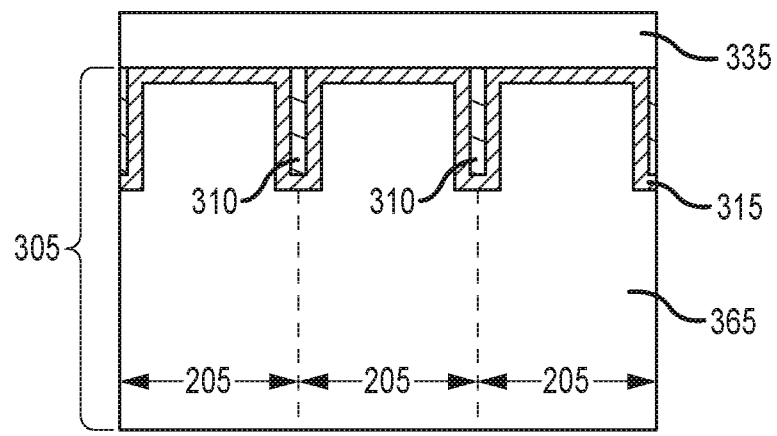

Referring to FIGS. 8A-J, an alternative method for forming an image sensor may comprise preparing the substrate 305 by preparing a series of trenches between adjacent pixels 205, lining the trenches with the first dielectric layer 315, and filling the trench with a material to form a series of isolation trenches 310. The second dielectric layer 335 may then be deposited to cover the in-pixel grid system as well as the exposed substrate 305 (FIG. 8A).

Figure 8B:
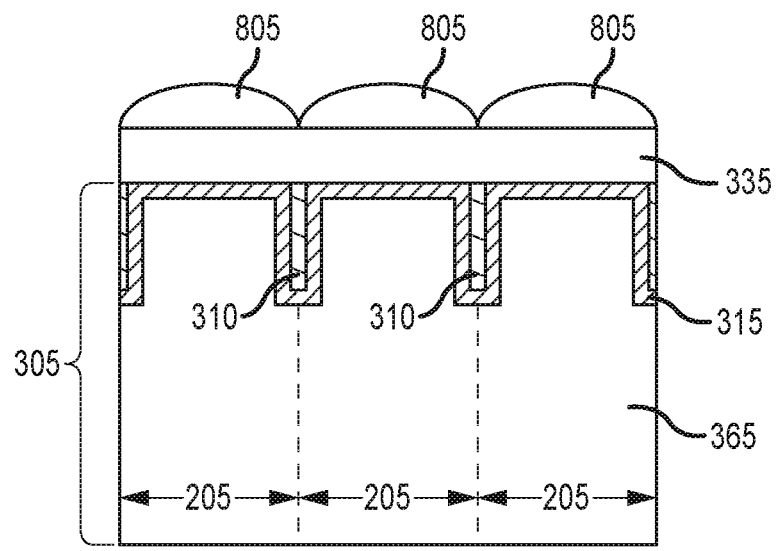
Figure 8C:
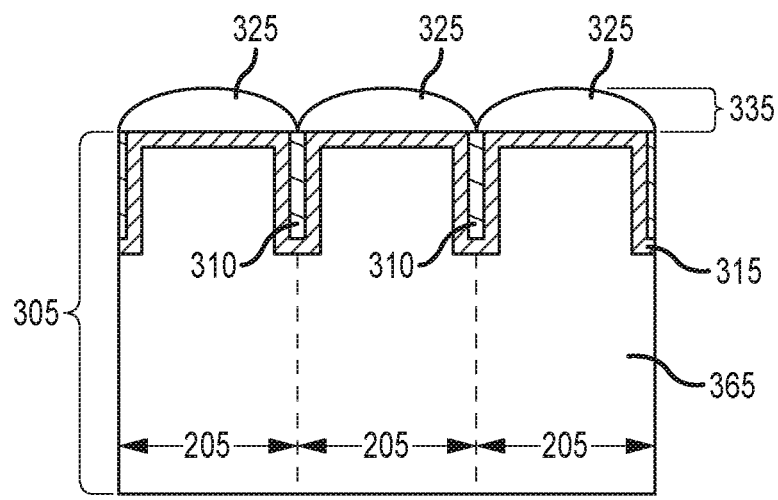

A plurality of first photoresist structures 805 may be formed on the surface of the second dielectric layer 335 (FIG. 8B). The first photoresist structures 805 are formed to have a convex surface. Conventional photolithography methods and processes may be utilized to form the first photoresist structures 805. Dry etch may then be performed to transfer the shape of the first photoresist structures 805 to the second dielectric layer 335 to form the dielectric elements 325 (FIG. 8C). For example, the dry etching process may utilize carbon tetrafluoride ($CF_4$), octafluorocyclobutane ($C_4F_8$), sulfur hexafluoride ($SF_6$), any other suitable gas, or combination thereof. In the present embodiment, adjacent dielectric elements 325 abut each other. In other embodiments, however, adjacent dielectric elements 325 may be separated by a gap, such as the dielectric elements 325 illustrated in FIG. 6. The size and position of the first photoresist structures 700 may substantially dictate the size and position of the dielectric elements 325.

Figure 8D:
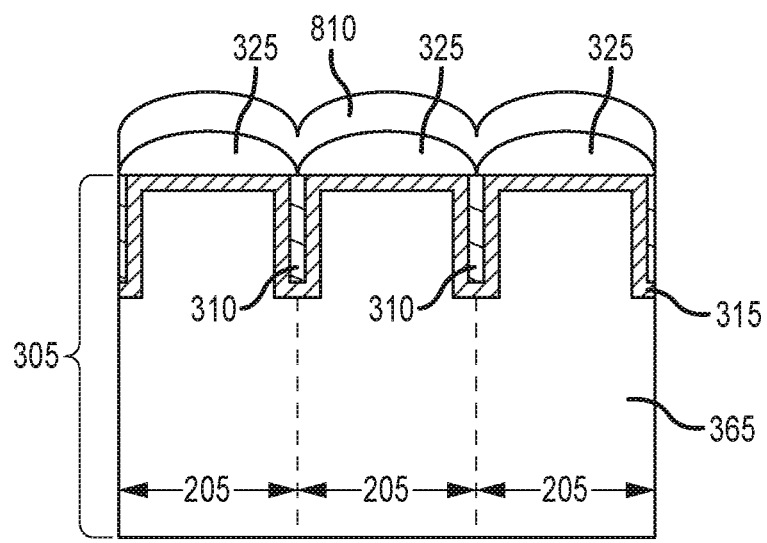
Figure 8E:
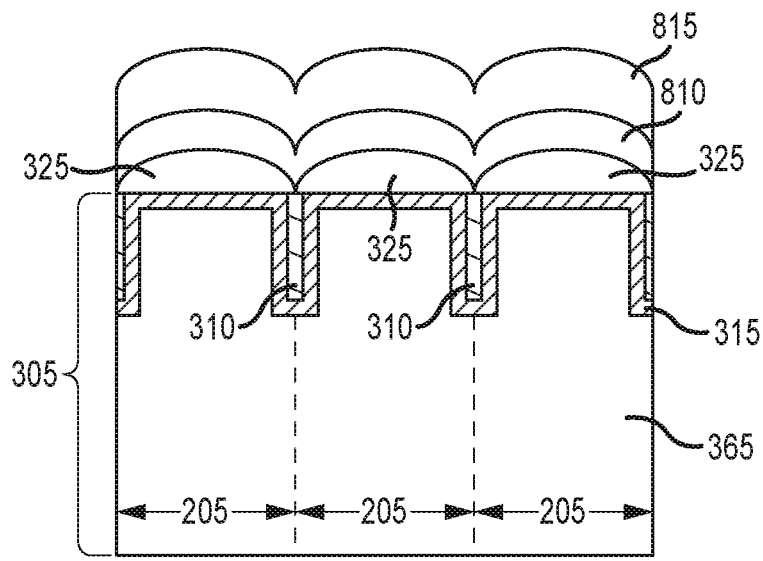

A metal layer 810 may then be deposited on and conform to a surface of the dielectric elements 325 (FIG. 8D). A third dielectric layer 815 may then be deposited on and conform to a surface of the metal layer 810 (FIG. 8E).

Figure 8F:
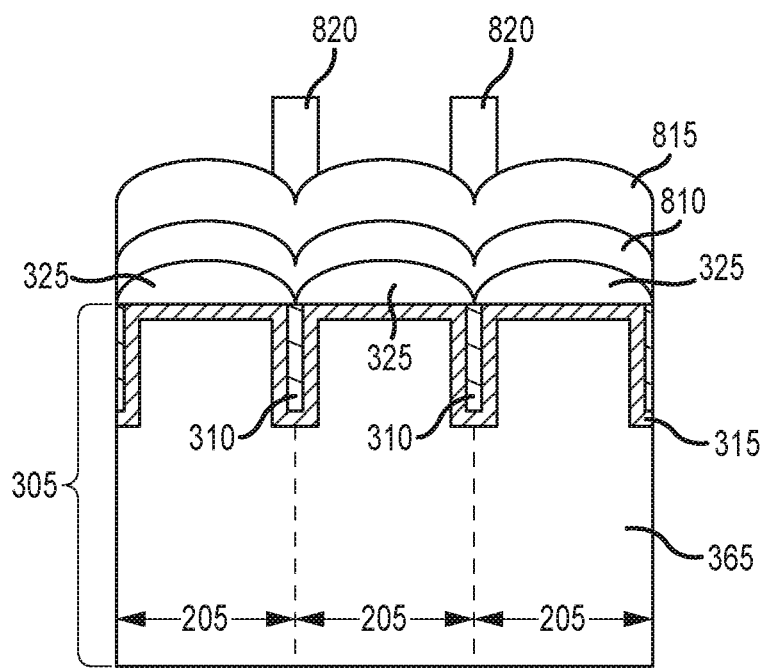
Figure 8G:
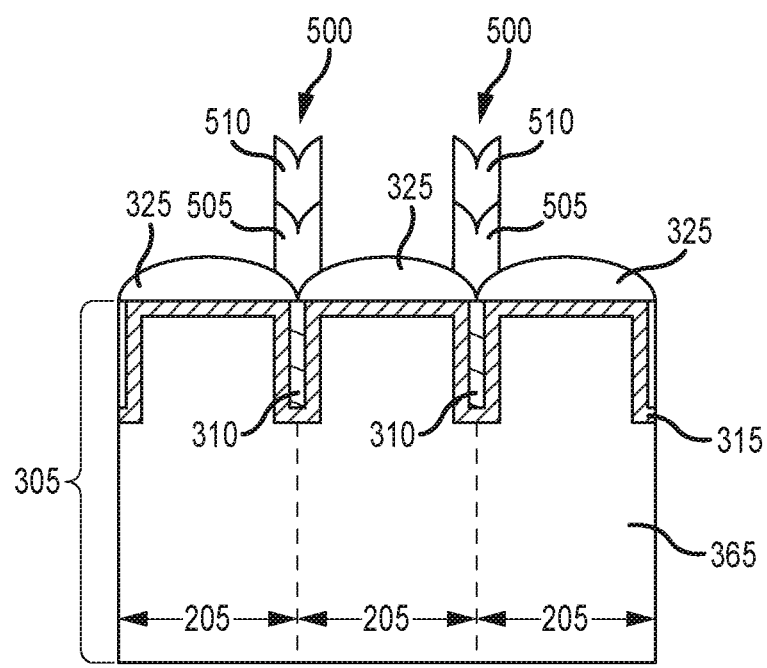

A second photoresist structure 820 is then patterned on the metal layer 815 (FIG. 8F). Dry etching may then be employed to remove portions of the third dielectric layer 815 and the metal layer 810 to form the composite grid structure 500 (FIG. 8G). For example, the dry etching process may utilize carbon tetrafluoride ($CF_4$), sulfur hexafluoride ($SF_6$), oxygen ($O_2$), any other suitable gas, or combination thereof.

Figure 8H:
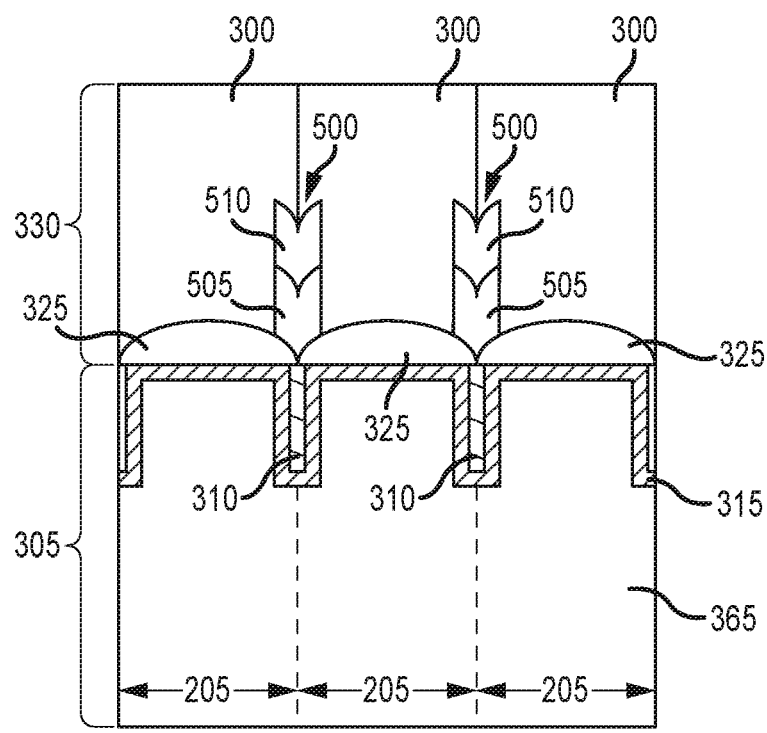
Figure 8I:
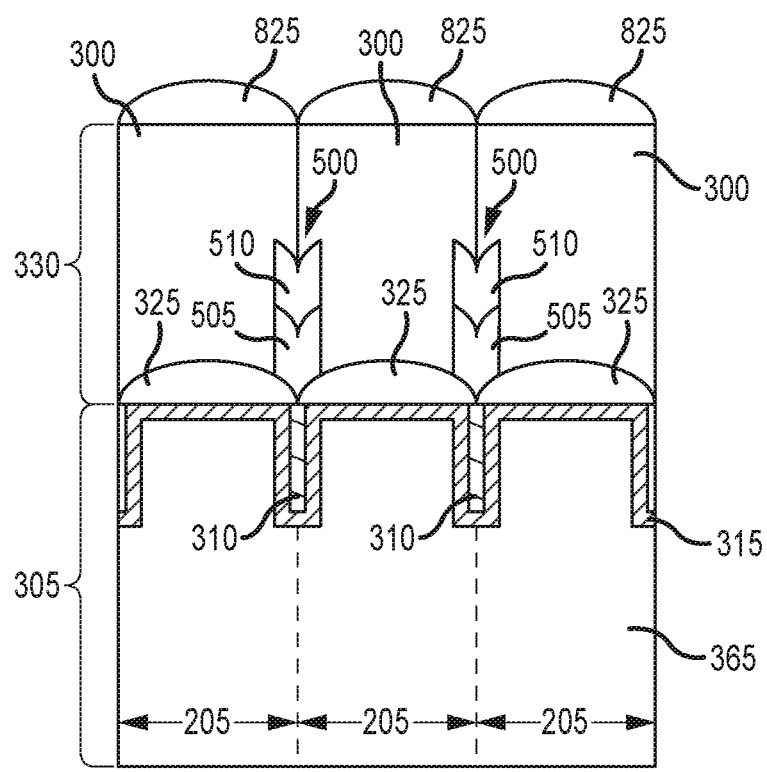
Figure 8J:
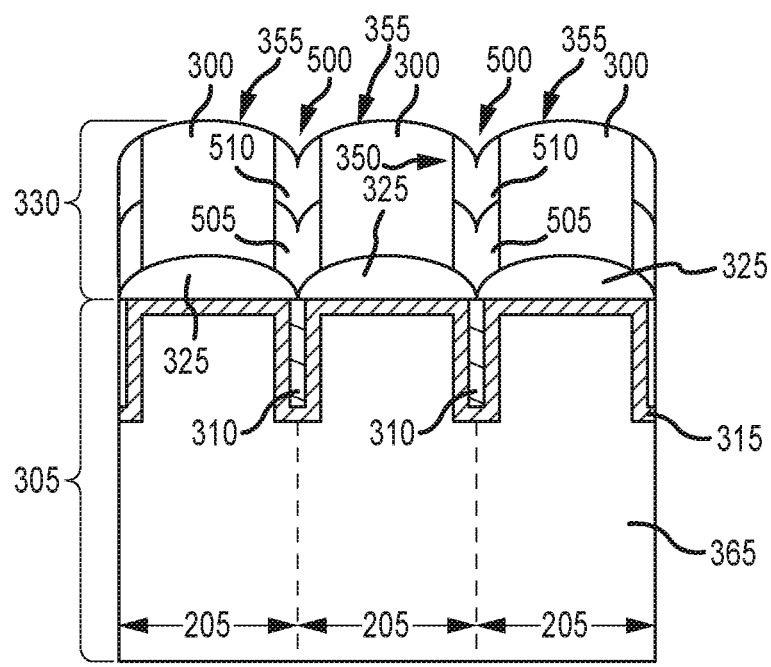

The CFA 330 is then deposited on the dielectric elements 325 and around the composite walls 500 (FIG. 8H). A plurality of third photoresist structures 825 are patterned on the CFA 330 (FIG. 8I). The third photoresist structures 825 may be formed in a similar manner as the first photoresist structures 805, wherein the third photoresist structures 825 have the same size and shape as the first photoresist structures 805. Dry etch may then be performed again to transfer the shape of the third photoresist structures 825 to the CFA 330 to form the color filters 300 that also operate as microlenses (FIG. 8J). For example, the dry etching process may utilize carbon tetrafluoride ($CF_4$), octafluorocyclobutane ($C_4F_8$), sulfur hexafluoride ($SF_6$), any other suitable gas, or combination thereof. The overall thickness of the color filters 300 may be determined according to the length of time of the dry etch and/or the gas used in the dry etch process. For example, the longer the dry etch process, the thinner the color filters 300. As such, in various embodiments, the surface 355 of the color filter 300 may be substantially conformal with a surface of the second end 350 of the composite grid structure 500. In alternative embodiments, the surface 355 of the color filter 300 may not be conformal with the surface of the second end 350 of the composite grid structure 500, in which case the surface 355 of the color filter 300 may be proximate to the surface of the second end 350 of the composite grid structure, wherein the second end 350 of the composite grid structure 500 remains below the surface 355 of the color filter 300.

According to various embodiments, as light enters the image sensor, the light may encounter materials with a particular refractive index. In an exemplary embodiment, the refractive indices of the materials in the image sensor 135 increase from the air to the silicon portion 365 of the substrate 305. For example, in a visible light range with wavelengths from 400 nm-800 nm, the color filter 300 may have a refractive index ranging from 1.6-1.8, the silicon nitride may have a refractive index ranging from 1.9-2.2, and the silicon portion 365 may have a refractive index ranging from 3.7-5.5.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An image sensor, comprising:
   a substrate, comprising a plurality of pixels;
   an array of dielectric elements disposed on a surface of the substrate, wherein;
     each dielectric element comprises a convex surface extending upwardly away from the surface of the substrate; and
     each dielectric element corresponds to and is vertically aligned with one pixel;
   an array of color filters, wherein:
     each color filter is disposed on the convex surface of one dielectric element; and
     each color filter comprises a convex surface positioned above the convex surface of the dielectric element; and
   wherein:
     the substrate, the array of dielectric elements, and the array of color filters form a vertical stack;
     each of the substrate, the dielectric elements, and the color filters have a predetermined refractive index; and
     the refractive indices of the vertical stack increase in value from the color filter to the substrate.

2. The image sensor according to claim 1, wherein the substrate further comprises a plurality of isolation trenches disposed between adjacent pixels.

3. The image sensor according to claim 1, further comprising a grid system disposed on the surface of the substrate and between adjacent dielectric elements.

4. The image sensor according to claim 3, wherein:
   the grid system is disposed between the color filters and the substrate; and
   a portion of at least one color filter abuts the grid system.

5. The image sensor according to claim 3, wherein:
   the grid system is disposed between the dielectric elements and the substrate; and
   adjacent dielectric elements overlap the grid system and abut each other.

6. The image sensor according to claim 3, wherein:
   the grid system comprises a composite grid structure arranged between adjacent color filters; and
   a first end of the composite grid structure extends from the surface of the substrate to the convex surfaces of the adjacent color filters.

7. The image sensor according to claim 6, wherein the first end of the composite grid structure comprises a tapered edge.

8. The image sensor according to claim 1, wherein:
   the convex surface of each color filter is substantially equal in shape to the convex surface of the underlying dielectric element; and
   a distance between the convex surface of the color filter and the convex surface of the underlying dielectric element is substantially uniform.

9. An imaging system, comprising:
   a substrate, comprising:
     an array of pixels arranged in rows and columns; and
     a plurality of isolation trenches arranged between adjacent pixels;
   an array of dielectric elements disposed on a surface of the substrate; wherein:
     each dielectric element is aligned vertically with one pixel of the array; and
     each dielectric element comprises a convex surface extending from a first edge to a second edge and extending upwardly away from the surface of the substrate;
   a grid system, wherein the grid system is disposed between adjacent dielectric elements and between the rows and columns of the array of pixels;
   an array of color filters, each color filter disposed on the convex surface of one dielectric element; wherein:
     each color filter comprises a convex surface extending from a first edge to a second edge and positioned above the convex surface of the dielectric element; and
     the convex surface of the color filter is substantially equal in shape to the convex surface of the dielectric elements; and
   wherein:
     the substrate, the dielectric elements, and the color filters form a vertical stack;
     each of the substrate, the dielectric elements, and the color filters have a predetermined refractive index; and
     the refractive indices of the vertical stack increase in value from the color filter to the substrate.

10. The imaging system according to claim 9, wherein:
the grid system is disposed between the color filters and the substrate; and
a portion of at least one color filter abuts the grid system.

11. The imaging system according to claim 9, wherein:
the grid system is disposed between the dielectric elements and the substrate; and
adjacent dielectric elements overlap the grid system and abut each other.

12. The imaging system according to claim 9, wherein the grid system comprises a composite grid structure arranged between adjacent color filters, and wherein a first end of the composite grid structure extends from the surface of the substrate to the convex surfaces of the adjacent color filters.

13. The imaging system according to claim 12, wherein the first end of the composite grid structure comprises a tapered edge.

14. A method for forming an image sensor utilizing a substrate, comprising:
forming an array of dielectric elements on a surface of the substrate, wherein each dielectric element comprises a convex surface extending upwardly away from the surface of the substrate;
forming an array of color filters on the convex surface of the dielectric elements, wherein:
each color filter comprises a convex surface substantially equal in shape to the convex surface of the dielectric element; and
each color filter is vertically aligned with one dielectric element; and
wherein forming the array of color filters comprises:
forming a color filter layer on the convex surface of the dielectric elements; and
etching the color filter layer to form the convex surface of each color filter.

15. The method for forming an image sensor according to claim 14, further comprising forming, in the substrate, a plurality of pixels and a plurality of isolation trenches between adjacent pixels.

16. The method for forming an image sensor according to claim 14, further comprising forming a metal grid on the surface of the substrate and between adjacent dielectric elements.

17. The method for forming an image sensor according to claim 14, further comprising forming a composite grid structure between adjacent color filters, wherein the composite grid structure comprises a metal layer and a dielectric layer.

18. The method for forming an image sensor according to claim 17, wherein forming the composite grid structure further comprises forming the metal layer on the convex surface of the dielectric elements.

19. The method for forming an image sensor according to claim 14, wherein forming the plurality of dielectric elements comprises:
forming a dielectric layer on the surface of the substrate;
etching the dielectric layer to form the convex surface of each dielectric element.

* * * * *